United States Patent
Koerner

(10) Patent No.: US 7,684,949 B2
(45) Date of Patent: Mar. 23, 2010

(54) APPARATUS AND METHOD FOR DETERMINING RELIABILITY OF AN INTEGRATED CIRCUIT

(75) Inventor: Henrich Koerner, Bruckmuehl (DE)

(73) Assignee: Infineon Technologies AG, Neubiberg (DE)

( * ) Notice: Subject to any disclaimer, the term of this patent is extended or adjusted under 35 U.S.C. 154(b) by 375 days.

(21) Appl. No.: 11/843,721

(22) Filed: Aug. 23, 2007

(65) Prior Publication Data
US 2008/0197870 A1 Aug. 21, 2008

(30) Foreign Application Priority Data
Aug. 23, 2006 (DE) .................. 10 2006 039 546

(51) Int. Cl.
G01R 31/02 (2006.01)
G01R 31/00 (2006.01)
G01R 27/00 (2006.01)
G06F 19/00 (2006.01)
G06F 17/40 (2006.01)

(52) U.S. Cl. .................. 702/117; 324/73.1; 324/500; 324/512; 324/522; 324/525; 324/537; 324/538; 324/543; 324/555; 340/500; 340/540; 340/635; 340/653; 702/1; 702/57; 702/64; 702/65; 702/108; 702/118; 702/127; 702/187; 702/189

(58) Field of Classification Search .............. 324/73.1, 324/500, 512, 519, 522, 523, 525, 527, 537, 324/538, 539, 543, 555, 600, 691, 713, 719, 324/765; 340/500, 540, 635, 649, 650, 652, 340/653, 654; 702/1, 33, 34, 57, 58, 59, 702/64, 65, 108, 117, 118, 127, 187, 189
See application file for complete search history.

(56) References Cited

U.S. PATENT DOCUMENTS

| 2,950,437 | A * | 8/1960 | Stahl | 324/73.1 |
|---|---|---|---|---|
| 2,996,666 | A * | 8/1961 | Baker | 324/73.1 |
| 3,082,374 | A * | 3/1963 | Buuck | 324/73.1 |
| 3,219,927 | A * | 11/1965 | Topp, Jr. et al. | 714/735 |
| 3,237,100 | A * | 2/1966 | Chalfin et al. | 324/108 |
| 3,487,304 | A * | 12/1969 | Kennedy | 324/73.1 |
| 3,522,532 | A * | 8/1970 | McCoy | 324/73.1 |
| 5,818,251 | A * | 10/1998 | Intrater | 324/765 |
| 6,724,214 | B2 * | 4/2004 | Manna et al. | 324/766 |
| 6,879,173 | B2 * | 4/2005 | Barr et al. | 324/763 |
| 6,983,223 | B2 * | 1/2006 | Schuh | 702/185 |
| 6,995,581 | B2 * | 2/2006 | Barr et al. | 324/763 |
| 7,240,258 | B1 * | 7/2007 | Hayes | 714/724 |
| 7,248,979 | B2 * | 7/2007 | Bandholz | 702/65 |
| 2004/0051553 | A1 * | 3/2004 | Manna et al. | 324/766 |
| 2004/0220775 | A1 * | 11/2004 | Schuh | 702/185 |
| 2004/0245981 | A1 * | 12/2004 | Barr et al. | 324/158.1 |
| 2004/0246008 | A1 * | 12/2004 | Barr et al. | 324/719 |
| 2005/0116733 | A1 * | 6/2005 | Barr et al. | 324/763 |
| 2006/0265158 | A1 * | 11/2006 | Bandholz | 702/65 |

* cited by examiner

*Primary Examiner*—Edward R Cosimano
(74) *Attorney, Agent, or Firm*—Philip Schlazer; Patent Department

(57) ABSTRACT

In an embodiment, an integrated circuit or chip is supplied to its intended application and a measurement quantity representing the state of one or a plurality of electrical connections in the chip is determined within the application environment of the chip and, if the measurement quantity determined does not correspond to predefined criteria, a corresponding signal is output.

37 Claims, 9 Drawing Sheets

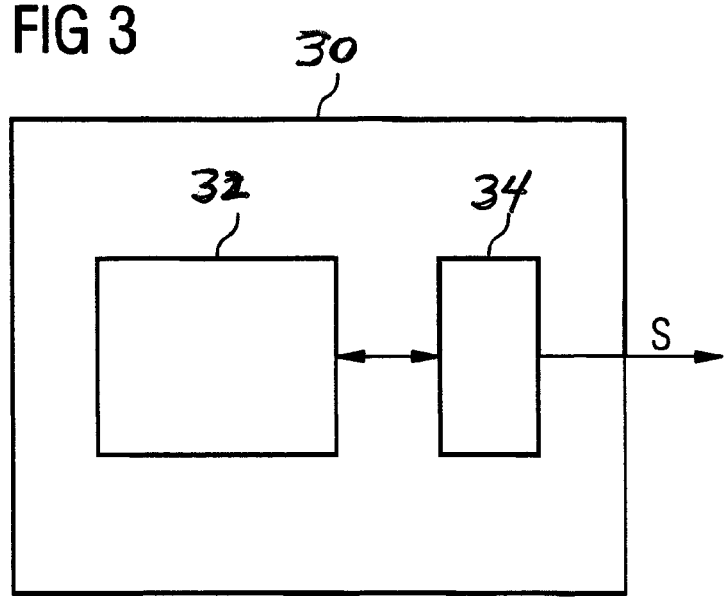
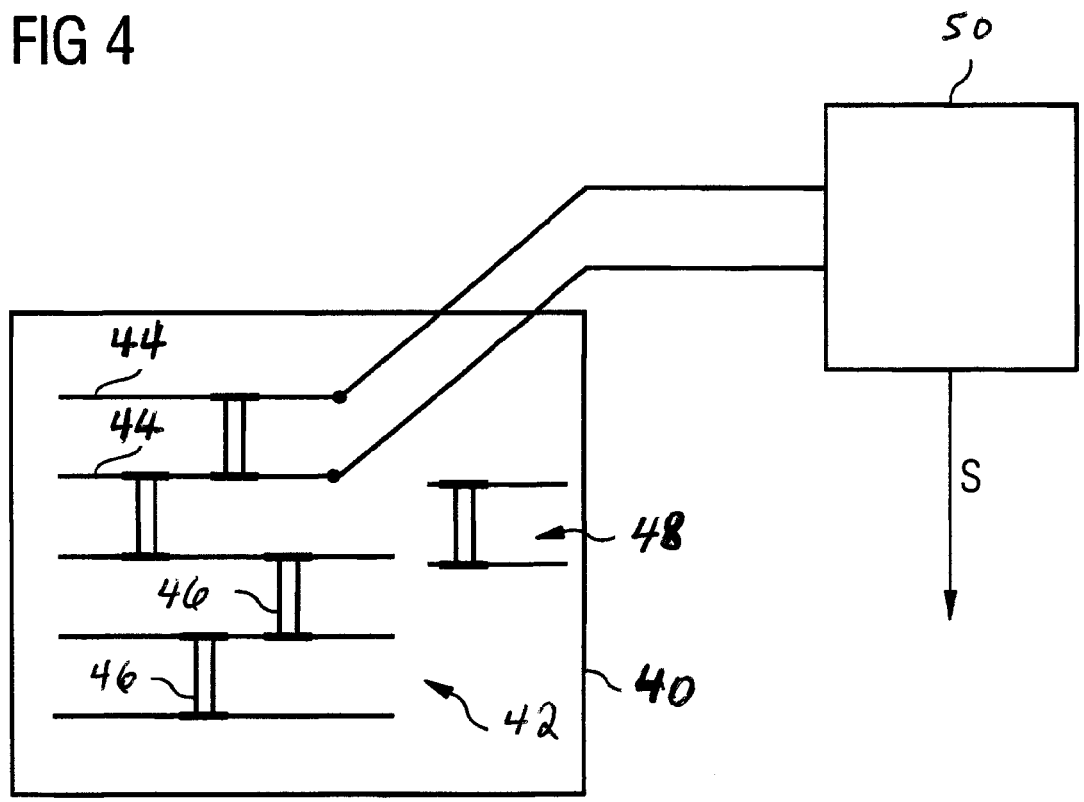

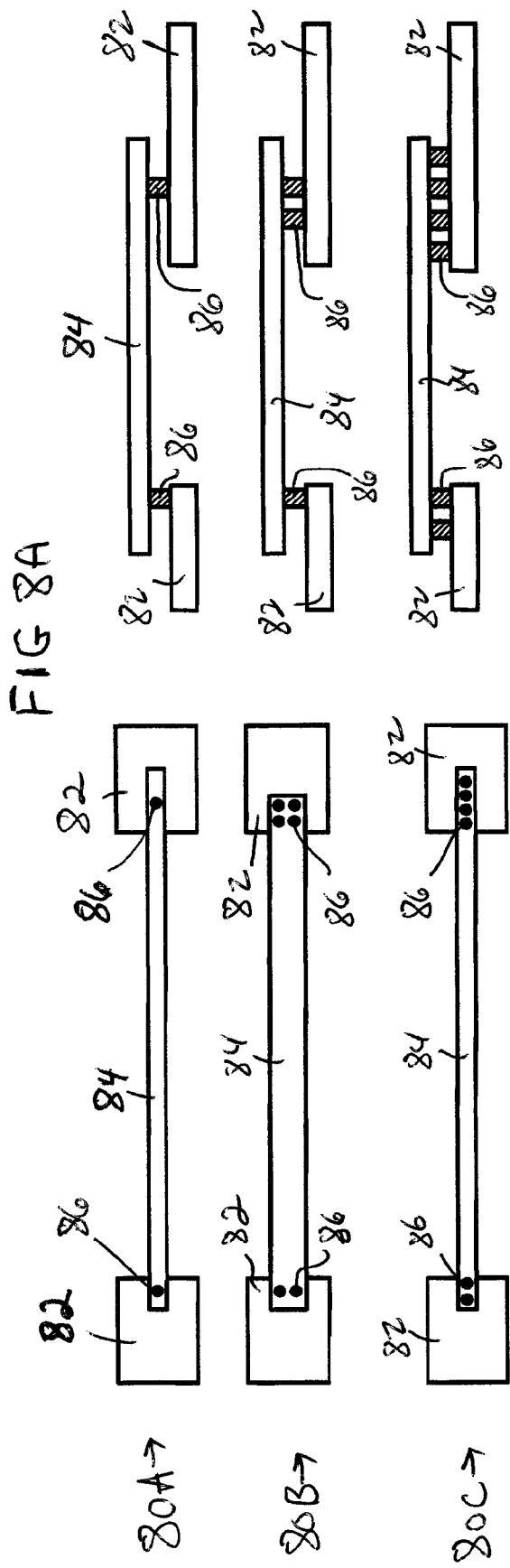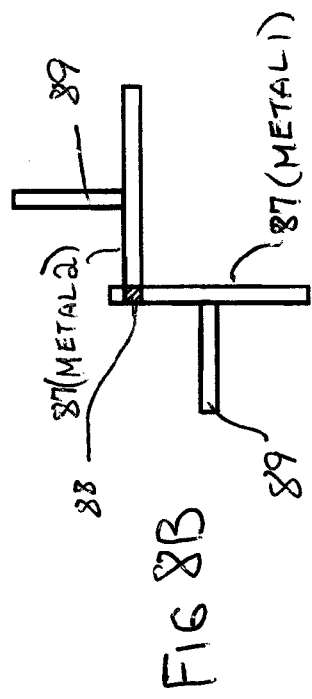
FIG 8A
FIG 8B

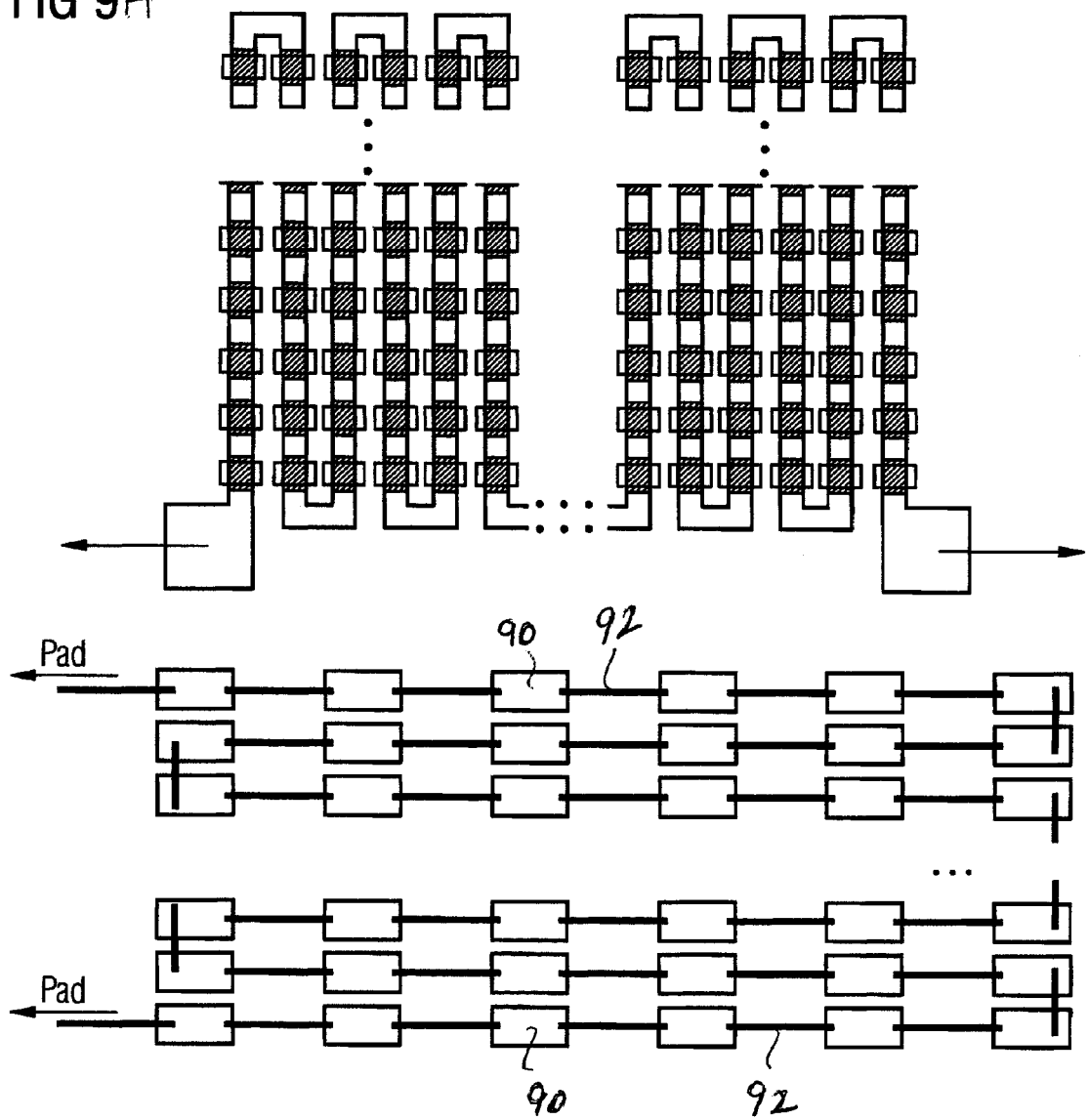

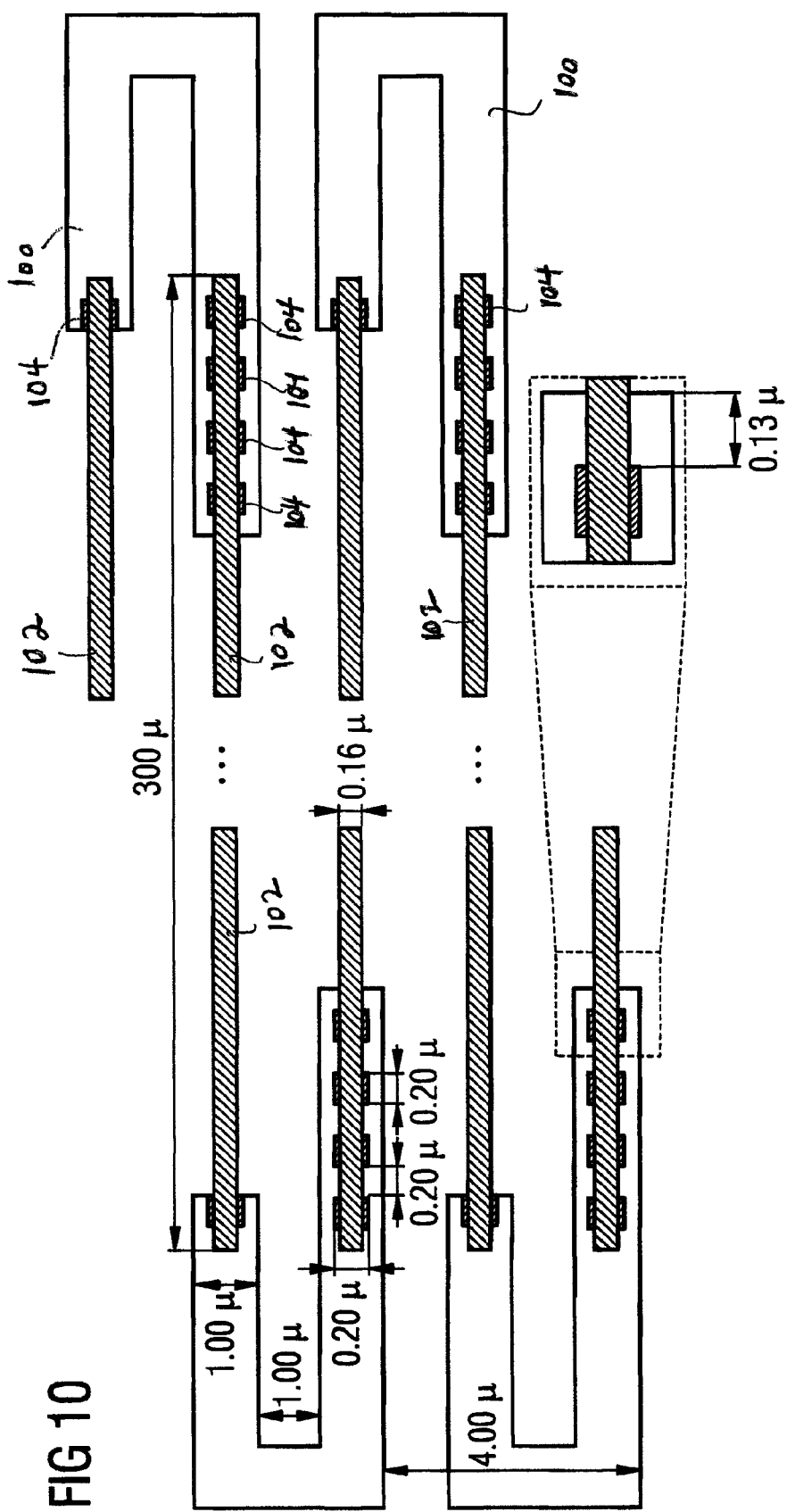

US 7,684,949 B2

APPARATUS AND METHOD FOR DETERMINING RELIABILITY OF AN INTEGRATED CIRCUIT

RELATED APPLICATION INFORMATION

This application claims priority to German Application Number 10 2006 039 546.8, filed on Aug. 23, 2006. German Application Number 10 2006 039 546.8 is hereby incorporated by reference herein in its entirely.

FIELD OF THE INVENTION

The present invention related generally to integrated circuits and, more particularly to devices and methods for determining the reliability of integrated circuits.

BACKGROUND OF THE INVENTION

Among microelectronic integrated circuits, which are also referred to as chips, there are those which are relevant to safety to an increased extent, for example control ICs for industrial applications or for motor vehicle applications, such as airbag control, ABS control or acceleration control. A sudden and unforeseen failure of such chips can have fatal consequences. Therefore, such chips have to be subject to elevated requirements with regard to a fail-safe nature and reliability.

SUMMARY OF THE INVENTION

One or more embodiments of the present invention relate to a method for determining the reliability of an integrated circuit (chip), a method for determining an item of information with regard to the state of one or a plurality of electrical connections in a chip, a measuring circuit for determining the reliability of a chip, a measuring circuit for determining an item of information with regard to the state of an electrical connection in a chip, a circuit having a measuring circuit according to the invention and a chip, and a chip having an electrical connection structure for testing the reliability of the chip.

BRIEF DESCRIPTION OF THE DRAWINGS

FIG. 3 shows an embodiment of the present invention;

FIG. 4 shows a further embodiment of the present invention;

FIGS. 8A and 8B show schematic illustrations of exemplary embodiments of added electrical connection structures serving for test purposes;

FIGS. 9A and 9B show schematic illustrations of further exemplary embodiments of added electrical connection structures serving for test purposes;

FIG. 10 shows a schematic illustration of a further exemplary embodiment of an added electrical connection structure serving for test purposes;

DETAILED DESCRIPTION OF THE INVENTION

The reliability of the chips is determined firstly by the functionality of the circuit components, such as transistors, capacitors, resistors or inductors, contained in them. Secondly, however, the reliability of the chip crucially depends on the functionality of the electrical connections between said circuit components. Said electrical connections are generally part of an electrical interconnect system, which generally has a plurality of metallization levels in which electrical connection lines run and which are interconnected by so-called via connections which are in each case contact-connected to connecting regions of the metallization levels. It is of major importance that these electrical connections of the electrical interconnect system are not impaired by any failures whatsoever throughout the service life of the chip and, consequently, no defects whatsoever occur during the chip production and processing process.

It is apparent from current data and surveys, however, that the service life of chips transferred to the application is often limited by premature failures on account of so-called extrinsic defects. Defects of this type are caused by random faulty processing or process deviations in fabrication which do not necessarily lead to an immediate production failure or an immediate malfunction of these components and, consequently, nor can they be detected by the customary parameter tests or monitoring controls in the production line. Components of this type initially exhibit a normal function and typical parameter values within the specified ranges, but a considerably shortened service life. In applications relevant to safety, the use of such chips can have fatal effects.

Figure 1:
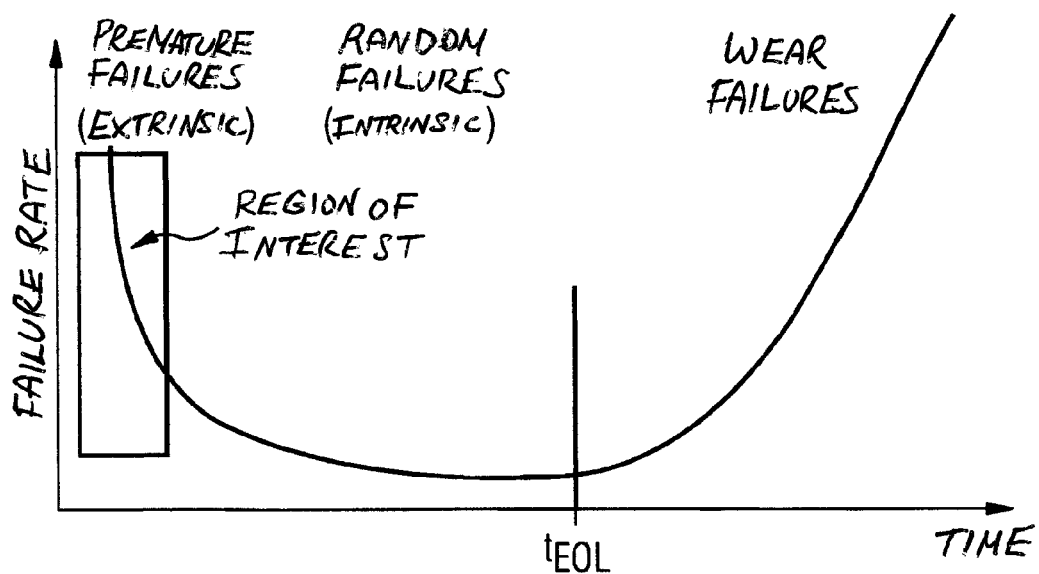
FIG. 1 shows a diagram for illustrating the qualitative profile of the failure rate of chips over time.

FIG. 1 qualitatively shows the dependence of the failure rate of chips on time. It is apparent from this that the number of prematurely occurring failures based on extrinsic defects or other non-intrinsic causes is much higher than the number of random failures caused by intrinsic fatigue. Such premature failures are extremely harmful for applications which have high relevance to safety.

Figure 2:
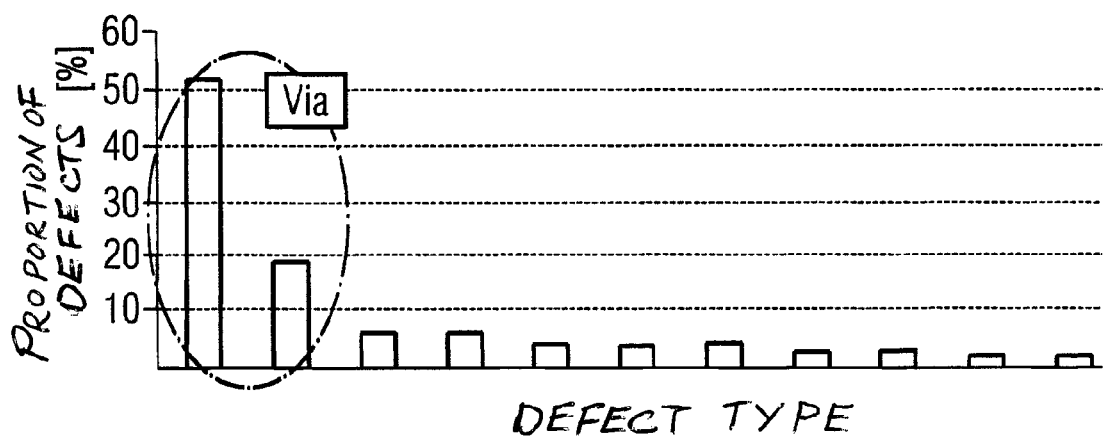
FIG. 2 shows a Pareto illustration of the various types of metallization defects and their relative percentage proportion.

FIG. 2 shows a Pareto illustration obtained experimentally for various defects in the so-called BEOL (back end of line), which encompasses the entire interconnect and contact system, that is to say essentially the electrical interconnect system already mentioned. The defect types represented on the x-axis, which are not designated in any more specific detail, were identified as the cause of premature failures of the chips. It is evident that approximately 70% of the defects were identified as defects regarding the via connections and additionally a further 20% were identified as defects regarding the metallic lines or the contacts. Consequently, reducing the extrinsic defects in the interconnections between different metallization levels or within the metallization levels is of extreme importance. As an alternative or in addition to this, however, intelligent methods are required in order to detect premature failures arising before they occur during the use of the chip.

There are already various yield, quality and reliability monitoring controls which are incorporated in the development and production process for semiconductor chips and which guarantee correct functioning throughout the predicted service life of the components. This likewise concerns the BEOL region, that is to say the electrical interconnect system of the chips. However, these known monitoring controls do not afford an adequate handle on detecting or avoiding premature failures.

A defect related to a via connection may initially bring about a rise in the electrical resistance between the via connection and a connecting region in a metallization level and later leads to a complete failure of the via connection. It may thus be possible to predict the later failure of the via connection. This idea may also apply to other electrical connections lying for example only within one and the same metallization level.

One embodiment of the invention relates to a method for determining the reliability of a chip, in which the chip is supplied to its intended application and a measurement quantity representing the state of one or a plurality of electrical connections in the chip is determined within an application environment of the chip and, for the case where the measurement quantity determined does not correspond to predefined criteria, a corresponding signal is output. A corresponding measuring circuit according to the invention for determining the reliability of a chip supplied to its intended application and also a circuit containing the chip and the measuring circuit are embodied in a corresponding manner in such a way that the circuit determines a measurement quantity representing a state of one or a plurality of electrical connections in the chip and, for the case where the measurement quantity does not correspond to predefined criteria, outputs a corresponding signal.

It is noted that the reliability of the chip may be monitored while the chip is already being used as intended. Consequently, the chip has already been incorporated into a superordinate system, for example by a customer. By way of example, the chip may be a microelectronic integrated circuit for controlling an airbag which has been incorporated for this purpose at its place provided for it within the electronic control system of the motor vehicle. In this application environment of the chip, the state of the electrical connections of the electrical interconnect system of the chip is then monitored in order to be able to estimate its reliability and hence its failsafe nature. If it emerges that the reliability is assessed as not sufficient, a corresponding signal is output in order to correspondingly warn the user. The user may be the end user, that is to say the driver of the motor vehicle in the example given.

In this case, preferably not all the electrical connections of the electrical interconnect system are monitored continuously, which would be associated with a very high measurement and evaluation outlay. Preferably, only one measurement quantity representing the state of the electrical connections of the electrical interconnect system of the chip is determined instead. In this case, the measurement quantity to be determined may be given by the electrical resistance but also by other physical quantities.

For the determination of the representative measurement quantity, it is possible, by way of example, to select a specific electrical connection structure on the basis of which the measurement quantity is determined. It is assumed with regard to said electrical connection structure that its properties and its state are representative of the rest of the electrical connections of the electrical interconnect system, with the result that its properties and its state permit a conclusion to be drawn about the reliability of the entire electrical interconnect system, that is to say also of the entire chip.

The selected electrical connection structure may be small in comparison with the entire electrical interconnect system and may have, by way of example, an individual electrical connection element or a small number of contiguous or non-contiguous electrical connection elements.

The selected electrical connection structure may be for example a part of the electrical interconnect system, in particular an active part of the electrical interconnect system of the chip. The electrical interconnect system usually has a plurality of metallization levels and at least one via connection between connecting regions lying in the metallization levels. The selected electrical connection structure may then have for example a via connection and/or a contact between a via connection and a connecting region and/or another electrical connection, the electrical connection elements mentioned being constituent parts of the active part of the interconnect system. By way of example, so-called Kelvin via connections may be used as via connections. The selected electrical connection structure may also be for example a contiguous structure composed of in each case one or a plurality of the electrical connection elements mentioned which extends for example over a plurality of metallization levels. It may furthermore be provided that either a plurality of individual electrical connection elements or a plurality of individual extended contiguous structures of connection elements which are distributed statistically over the electrical interconnect system are selected as connection structure.

It may equally be provided that the selected electrical connection structure is a constituent part of the passive part of the electrical interconnect system of the chip. The passive part of the electrical interconnect system has various elements which are not utilized for communicating electrical signals between components, such as, for example, filler and supporting structures, sealing and protective wirings or sections of fusible links that are no longer required.

In the exemplary embodiments described hitherto, the selected electrical connection structure is a part of the electrical interconnect system of the chip that is present anyway. However, it may also be provided that the selected electrical connection structure is provided in addition and lies outside the electrical interconnect system of the chip, in which case in particular the electrical connection elements contained in the electrical connection structure are produced in the same way as structurally identical electrical connection elements of the electrical interconnect system and by means of the same production steps.

An electrical connection structure selected according to the criteria specified above can to a good approximation be assumed to be representative of the totality of the electrical connections of the electrical interconnect system of the chip. If a defect is therefore ascertained at the selected electrical connection structure by the determination of a measurement quantity, then it can be assumed to a good approximation that said defect relates to at least one or a plurality of the electrical connections of the electrical interconnect system in the same way. Particularly if the selected electrical connection structure has been produced by means of the same production steps as the electrical connection elements of the electrical interconnect system, it can be assumed that defects determined in the case of the selected electrical connection structure are an indication of precisely such defects in the case of one or a plurality of the electrical connection elements of the electrical interconnect system. If the selected electrical connection structure is contained in the active or passive part of the electrical interconnect system, then this automatically means that it was produced by the same production steps as the electrical interconnect system. In so far as it is arranged outside the electrical interconnect system, then provision may additionally be made for using the same production steps as in the case of the electrical interconnect system during its production.

The method according to the invention and the corresponding measuring circuit according to the first aspect of the invention may furthermore be embodied in such a way that the measurement quantity is determined in a temporally continuous manner and, consequently, a continuous monitoring of the measurement quantity takes place and the reliability of the chip is correspondingly monitored continuously. As an alternative to this, it may be provided that the measurement quantity is determined only in predetermined time intervals, for example ½, 1, 2, 5 hours, and/or in predetermined situations or conditions, for example when the system is switched on or off.

It may furthermore be provided that the change in the measurement quantity with respect to time is determined. By way of example, an initial value of the measurement quantity shortly after the production or before or during the first start-up of the chip may be determined and stored and the change in the measurement quantity or the difference in the current measurement quantity with respect to the initial stored measurement quantity may be determined during use of the chip. Furthermore, a threshold value may be predefined for the measurement quantity or for the difference in the current measurement quantity with respect to the initial measurement quantity or else for the ratio of said difference to the current measurement quantity (relative change) and it may be provided that the signal is output if the threshold value is overshot or undershot. In the case of an electrical resistance as relevant measurement quantity, therefore, a signal may then be output if the measured resistance or the quantities derived therefrom as described above overshoot the predefined threshold value. The threshold value is preferably chosen to be low enough to limit the time duration for which the chip is used and to output the signal as early as possible and thus to leave the user a sufficient reaction time.

As already mentioned, a signal is output if the measurement quantity determined does not correspond to predefined criteria. Said signal may be converted into an acoustic or optical signal in a suitable manner and in such a way be brought to the attention of the user as an alarm signal. This signals to the user that the relevant chip is unreliable and will with high probability fail within a specific time. The user is therefore alerted and requested to go to a workshop in order that the relevant chip or a module or a product group on which the chip is mounted can be exchanged.

One advantage of the invention thus consists in the fact that, by means of the determination of reliability as described, it is possible to avoid the sudden and unexpected failure of a chip or module on account of premature failures of electrical connections during the first period of use. The advance warning of the user is extremely important precisely in safety-relevant applications such as airbag control as mentioned. In this case, the invention relates to any prematurely occurring faults and defects of electrical connections that are caused by process deviations, incorrect processing or incorrect treatment during component production, incorrect treatment, overstressing or other instances of extreme loading of the component during the application and other fault sources for premature via and metallization defects. The determination of reliability is preferably carried out on a part of the respective chip which has undergone exactly the same relevant process steps as the electrical connections of the electrical interconnect system. Consequently, the monitoring method is not carried out on a test wafer or the like, but rather preferably always on structures on the relevant chip. During their production, these structures have therefore experienced the same process deviations and anomalies as the electrical connections (e.g. instances of thermal or current loading, ESD pulses, etc.). Consequently, these structures are the best and most accurate indicator of potential premature failures of the chip. One or more embodiments of the invention also registers other premature defects of the chips with regard to the electrical connections that have been caused by e.g. stress migration (high thermal stress), electromigration (combined thermal and electrical stress) or increased and repeated thermal cycles. Defects of this type can also be detected by the methods and measuring circuits according to one or more embodiments of the invention.

Another embodiment of the invention relates to a method for determining an item of information with regard to the state of one or a plurality of electrical connections in a chip having a plurality of metallization levels and at least one via connection between two metallization levels, in which method a measurement quantity is determined with regard to a selected electrical connection structure containing at least one via connection, and if the measurement quantity determined does not correspond to predefined criteria, a corresponding signal is output. A corresponding measuring circuit according to the invention for determining an item of information with regard to the state of one or a plurality of electrical connections in a chip having a plurality of metallization levels and at least one via connection between two metallization levels, and also a circuit containing the chip and the measuring circuit are embodied in such a way that a measurement quantity is determined with regard to a selected electrical connection structure containing at least one via connection, and, if the measurement quantity determined does not correspond to predefined criteria, a corresponding signal is output.

It may be provided in this case that the chip is supplied to its intended application and the measurement quantity is determined within an application environment of the chip and, if appropriate, the signal is output.

This embodiment of the invention may be developed and configured in the same way as has already been described further above in connection with other embodiments of the invention.

Another embodiment of the invention relates to a chip, having an electrical interconnect system and an electrical connection structure for testing the reliability of the chip, said structure being arranged outside the electrical interconnect system. In this case, it is preferably provided that the electrical connection elements contained in the electrical connection structure are produced in the same way as structurally identical electrical connection elements of the electrical interconnect system. In particular, it may be provided that the electrical interconnect system has a plurality of metallization levels and the electrical connection structure has a via connection and/or a contact between a via connection and a connecting region and/or another electrical connection, the connecting region or the other electrical connection being arranged in a level that is coplanar with one of the metallization levels of the electrical interconnect system. The connecting region or the other electrical connection is thus produced in one and the same level as corresponding connecting regions and electrical connections of a metallization level of the electrical interconnect system and by means of the same process steps.

Figure 5:
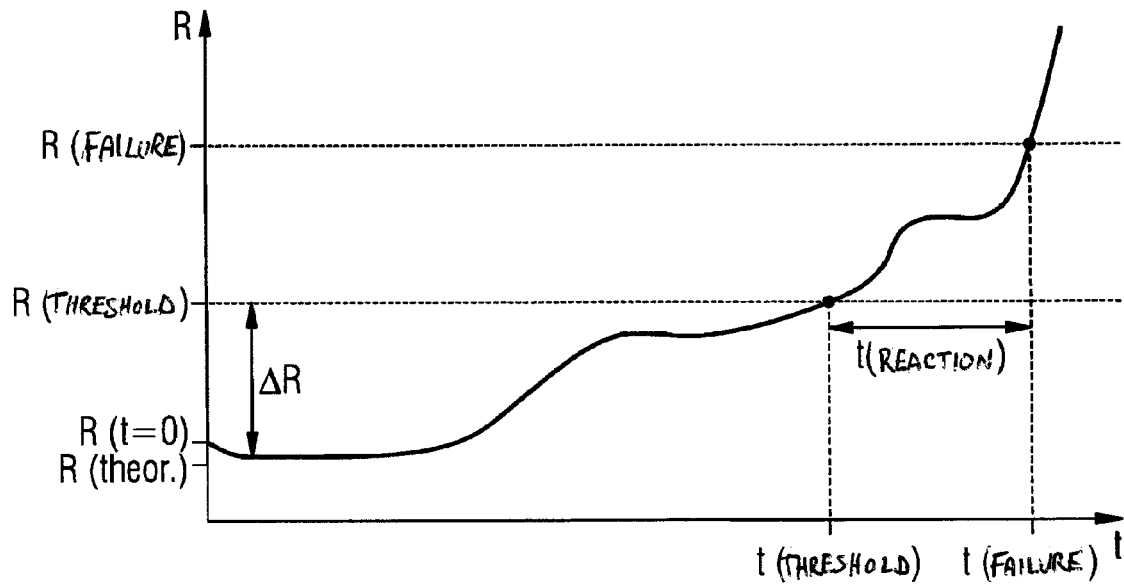
FIG. 5 shows a diagram for illustrating the time dependence of the electrical resistance of a defective electrical connection structure.
Figure 6:
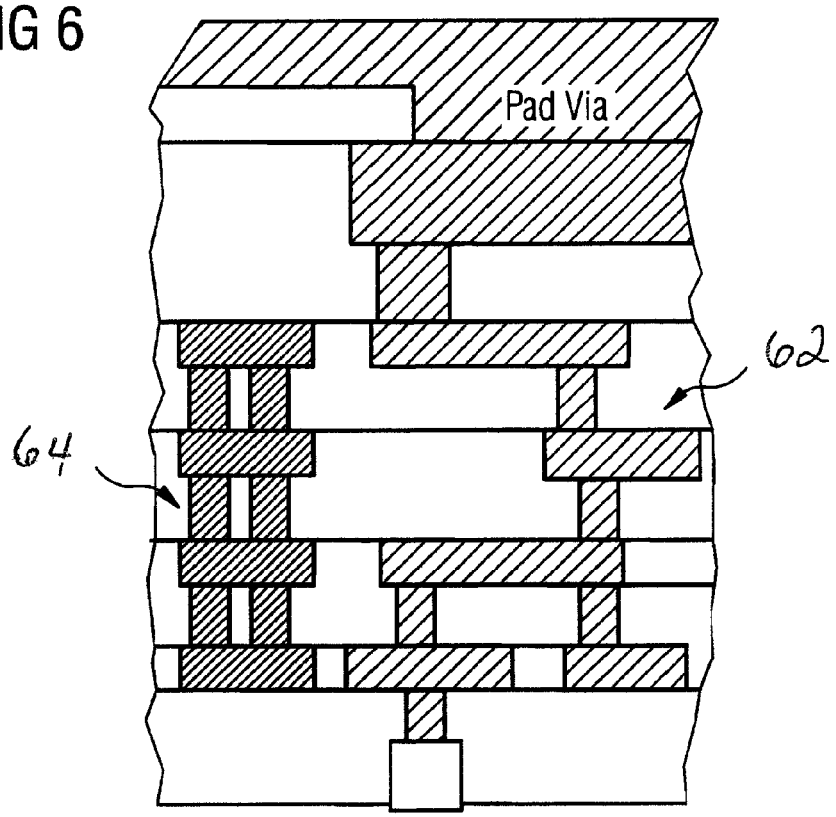
FIG. 6 shows a schematic illustration of an electrical connection system of a chip having active and passive regions.
Figure 7:
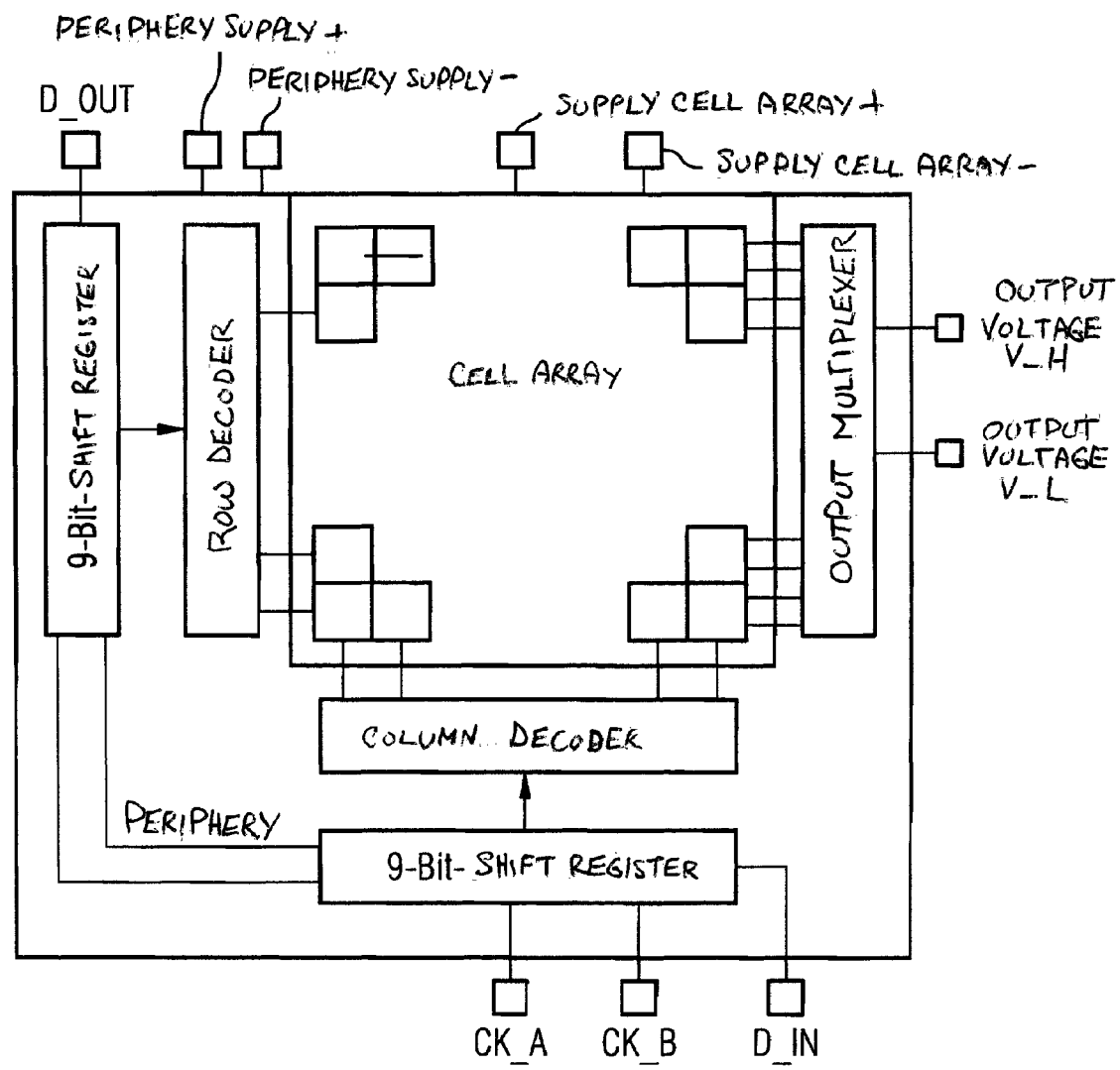
FIG. 7 shows a schematic illustration of an exemplary embodiment of a measuring circuit.
Figure 11A:
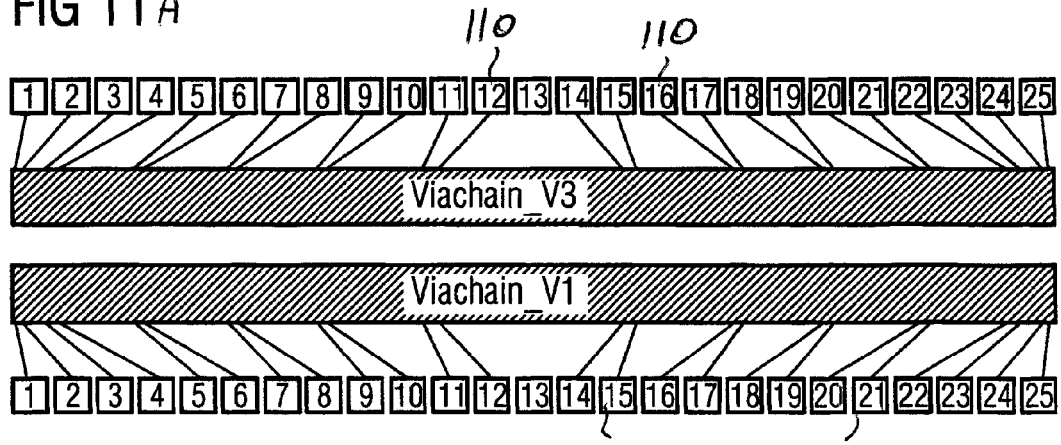
FIGS. 11A and 11B show schematic illustrations of further exemplary embodiments of added electrical connection structures serving for test purposes.
Figure 11B:
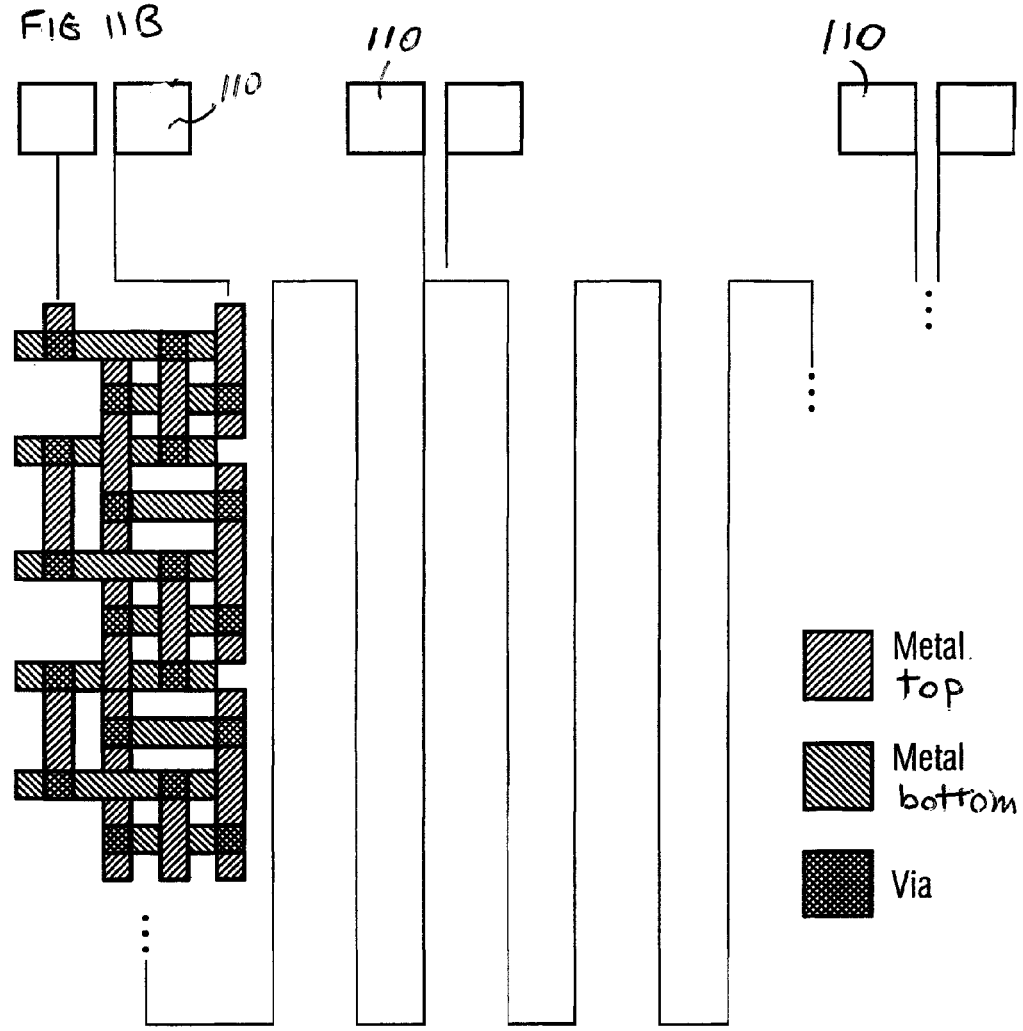
Figure 12:
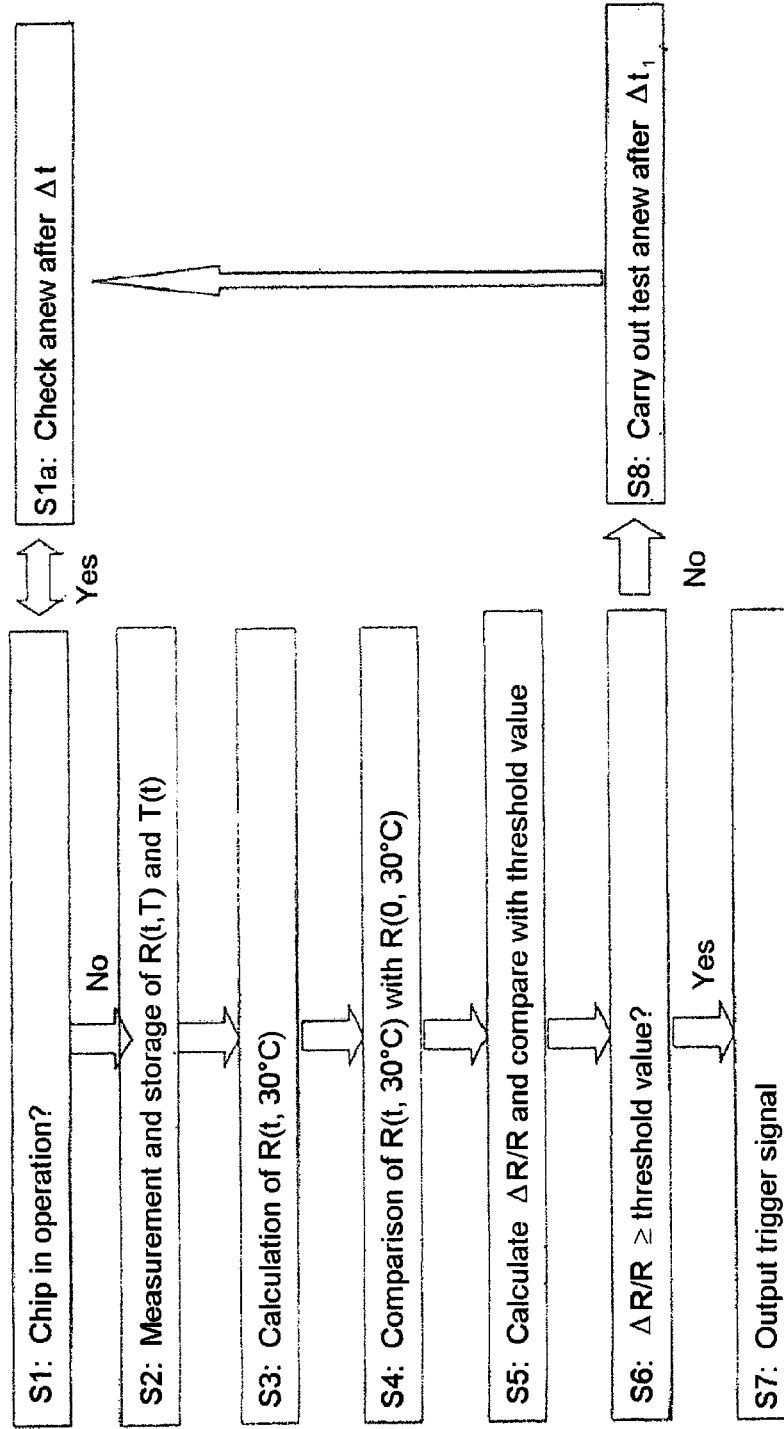
FIG. 12 shows a flow chart for a test sequence.

Exemplary embodiments of the invention are explained in more detail below with reference to the figures, in which:

FIG. 1 shows a diagram for illustrating the qualitative profile of the failure rate of chips over time;

FIG. 2 shows a Pareto illustration of the various types of metallization defects and their relative percentage proportion;

FIG. 3 shows an embodiment of the present invention;

FIG. 4 shows a further embodiment of the present invention;

FIG. 5 shows a diagram for illustrating the time dependence of the electrical resistance of a defective electrical connection structure;

FIG. 6 shows a schematic illustration of an electrical connection system of a chip having active and passive regions;

FIG. 7 shows a schematic illustration of an exemplary embodiment of a measuring circuit;

FIGS. 8A and 8B show schematic illustrations of exemplary embodiments of added electrical connection structures serving for test purposes;

FIGS. 9A and 9B show schematic illustrations of further exemplary embodiments of added electrical connection structures serving for test purposes;

FIG. 10 shows a schematic illustration of a further exemplary embodiment of an added electrical connection structure serving for test purposes;

FIGS. 11A and 11B show schematic illustrations of further exemplary embodiments of added electrical connection structures serving for test purposes; and FIG. 12 shows a flow chart for a test sequence.

FIG. 3 schematically illustrates an embodiment of the invention. It shows a chip 32, which is incorporated within an application environment 30 and has to fulfil specific functions in said application environment 30. The chip 32 may be for example a control IC for an airbag, for ABS control, acceleration control or for some other function in a motor vehicle or some other device, and the application environment 30 may be a superordinate electronic control system for the functions of the motor vehicle or the other device. The motor vehicle or the other device as a whole within which the chip 32 is incorporated may also be regarded as the application environment 30. However, by way of example, a module or a circuit board on which the chip 32 is mounted and which, for its part, is arranged suitably within the control electronics of the motor vehicle or the other device may also be regarded as the application environment 30. In other conceivable applications, the chip 32 may serve to control an industrial installation, a production installation or an aircraft, in which case the application environment 30 may once again be provided for example by the electronic control system of these devices mentioned.

The chip 32 is connected to a measuring circuit 34, which is accorded the function of monitoring the reliability of the chip 32. For this purpose, the measuring circuit 34 is connected to the chip 32 and determines a measurement quantity representing the state of one or a plurality of electrical connections in the chip 32, in particular the state of its electrical interconnect system. In this case, the connection between the measuring circuit 34 and the chip 32 may be wire-based. As an alternative, however, it may also have some other, i.e. wire-free remote connection (by radio or optically). Moreover, the measuring circuit 34 may be arranged separately from and outside the chip 32 within the application environment 30, as illustrated in FIG. 3. As an alternative, however, it may also be arranged on the chip 32 itself and thus be a part of the microelectronic circuit integrated on the chip 32.

The measuring circuit 34 determines a measurement quantity and afterwards carries out an evaluation of the measurement quantity. If this evaluation reveals that the measurement quantity determined does not correspond to predefined criteria, then the measuring circuit 34 outputs a corresponding signal S towards the outside. Said signal S indicates that the chip 32 does not have sufficient reliability and its complete failure is imminent. The signal output by the measuring circuit 34 may be converted into an optical or acoustic signal that can be perceived by the user, for example the driver of the motor vehicle, with the result that the user can be prompted to take suitable measures in order that damage is not caused by the sudden total failure of the chip 32.

FIG. 4 illustrates a further embodiment of the invention in schematic form. It shows a chip 40 containing an electrical interconnect system 42. The electrical interconnect system 42 essentially has metallization levels 44 and via connections 46 between the metallization levels 44. Electrical lines and wirings for connecting the electronic components of the chip 40 to one another are situated within the metallization levels 44. The via connections 46 are connected to connecting regions arranged in the metallization levels 44. If appropriate, an additional electrical connection structure 48 may be arranged outside the electrical interconnect system 42. In the case illustrated, said additional electrical connection structure 48 has an individual via connection connected to two connecting regions which are in each case arranged within levels which are coplanar with specific metallization levels 44 of the electrical interconnect system 42. The additional electrical connection structure 48 and its connection elements have preferably been produced by means of the same production steps as the connection elements of the electrical interconnect system 42.

A measuring circuit 50 is connected to the chip 40, the function of said measuring circuit consisting in determining an item of information with regard to the state of one or a plurality of electrical connections of the chip 40, in particular of its electrical interconnect system 42. For this purpose, the measuring circuit 50 can be connected to a selected electrical connection structure in order to determine, with regard to said selected electrical connection structure, a measurement quantity representing the state of the electrical connections of the chip 40. If this measurement quantity determined does not correspond to predefined criteria, the measuring circuit 50 outputs a signal S. In FIG. 4, the measuring circuit 50 is connected by way of example to contact points of the two upper metallization levels 44. However, it may also be connected for example to the additional electrical connection structure 48 that is optionally present.

FIG. 5 shows the temporal dependence of the electrical resistance of a hypothetical electrical connection. The electrical resistance R can be used as measurement quantity. The instant t=0 denotes for example an instant directly after the production of the electrical connection at which the electrical resistance R(t=0) still has a value relatively close to the theoretical value R(theor), which it will also maintain for a certain time. The defective character of the electrical connection is therefore not recognized by the customary in-line monitoring controls during the production process. The defect consists for example in an incipient detachment of a via connection from a connecting region of a metallization level. After a certain time has elapsed within which the electrical connection is in use as part of the electrical interconnect system of the chip, said detachment progresses to an extent such that the electrical resistance rises. As soon as the electrical resistance R overshoots a trigger threshold, in particular a predefined threshold value R(threshold) at an instant t(threshold), the signal is triggered in order to warn the user about the imminent total failure of the electrical connection. The threshold value R(threshold) is set to be low enough to leave the user a sufficient reaction time t(reaction) in order that said user can take corresponding precautions in order for example to exchange the chip or the complete module on which the chip is situated. At an instant t(failure), the electrical resistance R has then reached a value R(failure) which is tantamount to a failure of the electrical connection on account of the only very low current flow. Instead of predefining a specific value of the electrical resistance R as threshold value R(threshold), it is also possible to predefine a quantity derived therefrom, in particular a threshold value for the change in resistance $\Delta R$ or for the relative change in resistance $\Delta R/R(t=0)$.

FIG. 6 illustrates a schematic cross-sectional view of a portion of the electrical interconnect system of a chip. This illustration serves only to illustrate the fact that the electrical interconnect system usually has an active part 62 and a passive part 64 which are arranged in a plurality of metallization levels and have via connections that interconnect connecting regions in the metallization levels. The active part 62 serves to interconnect the electronic components arranged in the metallization levels. By contrast, the passive part 64 does not serve to exchange electrical signals between components, but rather only contains components such as, for example, sealing and protective wirings, filler and supporting structures or portions of fusible links that are no longer required, and the like. The electrical connection structure that is to be selected and is to be used for the purpose of the invention may be contained in the active part 62 or the passive part 64 or in both.

FIG. 7 schematically illustrates an exemplary embodiment of a measuring circuit. In this exemplary embodiment, some of the electrical connections of the electrical interconnect system of the chip that are present anyway are tested, it being possible to test connection elements both of the active part and of the passive part of the electrical interconnect system in accordance with FIG. 6. All the electrical connections are regarded as a cell array and a specific predefined number of individual electrical connections or connection structures which are distributed statistically over the cell array, for example, can be selected by means of a row decoder and a column decoder for the test. They are selected successively, for example, and loaded with a current, and the voltage drop across each individual electrical connection is measured, for example, which is a measure of the electrical resistance of the electrical connection.

FIGS. 8A, 8B, 9A, 9B, 10, 11A and 11B in each case show exemplary embodiments of added electrical connection structures, which are therefore not part of the electrical interconnect system that is contained in the chip anyway.

FIG. 8A illustrates a plurality of exemplary embodiments of added electrical connection structures 80A, 80B and 80C, wherein a plan view is in each case shown on the left-hand side and the corresponding side view of the respective electrical connection structure is shown on the right-hand side. The electrical connection structures illustrated are thus not part of the electrical connection system of the chip that is present anyway, but rather connection structures produced additionally outside the latter. However, the connecting regions are preferably situated in levels which are coplanar with corresponding metallization levels of the electrical interconnect system of the chip, the connecting regions and the via connections between the connecting regions preferably being produced by means of the same production steps as the corresponding connection elements in the metallization levels of the electrical interconnect system.

The upper electrical connection structure 80A as shown in FIG. 8A contains two connecting regions 82 of a lower level and a connection web 84 of an upper level, which is connected to the connecting regions of the lower level by two via connections 86. In the case of the middle electrical connection structure 80B, the web is widened and has two via connections 86 to the connecting region that lie next to one another on the left-hand connecting side and four via connections 86 to the connecting region that are arranged in a square on the right-hand side. In the case of the lower electrical connection structure 80C, two via connections 86 are connected to the respective connecting regions 82, 84 on the left-hand connecting side and four via connections 86 are connected to the respective connecting regions 82, 84 on the right-hand connecting side, the via connections all being arranged along the direction of the web.

FIG. 8B shows an electrical connection structure showing two electrical interconnects 87 which lie in two different metallization levels METAL1, METAL2 and which are arranged at a right angle with respect to one another in plan view and are connected to one another by a via connection 88. Additional spur lines 89 are also connected to the interconnects in order, under certain circumstances, to be able to detect further measurement quantities or signals.

FIGS. 9A and 9B illustrates two exemplary embodiments of multiple via connections arranged one behind another in each case, so-called via chains. In the embodiment shown in FIG. 9B, the relatively large-area connecting regions 90 are arranged in a lower metallization level, while the narrow connection webs 92 between the connecting regions are arranged in an upper metallization level and connected to the connecting regions by via connections. In the embodiments shown in FIGS. 9A and 9B, the via chains are embodied in meandering fashion. In addition it may be provided, as in FIGS. 8A and 8B, that the connection webs of the upper metallization level are connected to the connecting regions lying in the lower metallization level by means of a plurality of via connections.

FIG. 10 shows a further exemplary embodiment of an added electrical connection structure having a meandering structure, wherein connecting regions 100 that are bent away doubly at right angles are arranged in a lower metallization level, and connection webs 102 which connect the end portions of the connecting regions to one another and are connected to the end portions by means of via connections 104 are arranged in an upper metallization level. In this case, it is provided that a respective connection web 102 is connected to one of the connecting regions 100 by four via connections 104 arranged one behind another in the direction of the connection web. The numerical indications with regard to the dimensions of the interconnect widths and lengths are merely to be understood by way of example.

FIGS. 11A and 11B illustrates a further exemplary embodiment of an added electrical connection structure. This electrical connection structure has two via chains Viachain_V3 and Viachain_V1 which are superimposed on one another and have a meandering course. The meandering course is depicted in the partial illustration of FIG. 11B, the structure of the via chains that are superimposed on one another being shown in detail at an initial portion. The construction and the structure become clear from the different hatchings indicating the metallization level (top, bottom) in which the respective interconnect is arranged. Taps 110 connected to pads may be arranged, as illustrated, at periodically repeating portions of the meandering form. In this way it is possible to determine the electrical resistance between arbitrary portions of the via chain. In the partial illustration of FIG. 11A, two via chains Viachain_V3 and Viachain_V1 constructed in this way are arranged one above another, the pads in each case being consecutively numbered with numbers from 1 to 25.

Two further exemplary embodiments, which are not illustrated in the figures, are explained in more detail below.

In one of these exemplary embodiments, the reliability of a flash controller chip produced using 0.25 μm technology is intended to be monitored. In particular, the intention is to monitor prematurely occurring defects of the via connections or of the metallization in the metallization levels 1 to 3 from a total of four metallization levels. The electrical connection structure provided for the monitoring is a suitable portion of the electrical interconnect system of the chip and has the following dimensions:

| | |
|---|---|
| Total length: | 20 μm |
| Interconnect width: | 0.28 μm |
| Interconnect thickness (AlCu): | 0.33 μm |

Both ends of the electrical connection structure are terminated with at least one via connection. The connection structure has an initial resistance R(t=0, T=30° C.) of approximately 10Ω, which was measured at 30° C. during the final product test and was written to a non-volatile memory or was fixedly programmed in a ROM (read-only memory) integrated on the chip or adjacent to the chip. In the case of correct processing, the two via connections contribute approximately 2Ω to the total resistance.

Upon each switch-on and switch-off, the electrical resistance of the connection structure is measured anew by sending a current of 0.01-2 mA through the connection structure and measuring the corresponding voltage drop. This test can optionally be carried out directly at any desired ambient temperature. Together with the resistance, the ambient temperature of the chip can be measured by means of a resistance thermometer integrated on the chip. With the aid of the known temperature coefficient (TCR) of the AlCu metallization, which is likewise stored in the ROM memory, the present resistance R(t, T) can easily be converted into the corresponding resistance R(t, 30° C.):

$$R(T_2) = R(T_1) + TCR \cdot R(T_1) \cdot \Delta T$$

The calculated resistance R(t, 30° C.) is compared with the value stored in the ROM memory. An extrinsic defect directly in the vicinity of the via connection leads to a continuous rise in the electrical resistance of the via connection over time. Even if the resistance of the via connection rises by 500 or 1000% to 5 or 10Ω, the contact between the via connection and the connecting region of the metallization level is still functional. In the further course of events, however, the contact will fail completely. If the total resistance of the electrical connection structure rises to approximately 28Ω, then this corresponds to a relative rise of 180%. If the trigger threshold for the rise and for the triggering of the alarm signal was set at 50 or 100%, a sufficient temporal safety margin is still provided for the user in order to take measures before the chip or the module finally fails.

Provision may also be made for not storing the present initial resistance R(0, 30° C.) measured on the chip in the memory, but rather a theoretical (ideal) initial resistance R*(0, 30° C.) calculated under the assumption of ideal surfaces and critical dimensions exactly according to the design rules of the connection structure. Consequently, any deviation in the dimension or the surface quality which may already be a potential cause of a prematurely occurring defect is immediately identified and recorded and pursued further by way of the electrical resistance of the connection structure and its change.

The calculation and assessment can be carried out by means of a small assessment or comparator logic circuit, which only needs to be present once on the chip and can test each connection structure in each metallization level.

In the other of these exemplary embodiments, the reliability of a motor vehicle control chip produced using 110 nm technology is monitored with regard to prematurely occurring defects of the via connection or the metallization. In this exemplary embodiment, the metallizations are produced from copper (Cu). In this exemplary embodiment, moreover, the electrical connection structure to be tested is provided in the form of an additional connection structure outside the electrical interconnect system. Said additional electrical connection structure has, in each metallization level of the chip, connection elements having the following dimensions:

| | |
|---|---|
| Total length: | 10 μm |
| Interconnect width: | 0.2 μm (1x); |
| | 0.4 μm (2x) |
| Interconnect thickness (Cu): | 0.2 μm (1x); |
| | 0.45 μm (2x) |

Both ends of the connection structure are terminated with at least one via connection. The connection structure has an initial electrical resistance R(0, 30° C.) of approximately 5-6Ω, which was measured at 30° C. during the final product test and was stored or programmed in a non-volatile memory or a ROM integrated on the chip or arranged alongside the chip. Given correct processing, the two via connections contribute approximately 2Ω to the total resistance.

After predetermined intervals (e.g. every 1, 2, 5 or 10 hours), the resistance of the connection structure is measured by application of a current of 0.01-2 mA through the connection structure and measurement of the corresponding voltage drop. This test can be carried out at any time and at any ambient temperature. Together with the resistance, the ambient temperature of the chip can be measured using a resistance thermometer, which may be integrated on the chip. With the aid of the known temperature coefficient (TCR) of the Cu metallization, which is likewise stored in the memory, the present resistance R(t, T) can easily be converted into the corresponding resistance R(t, 30° C.):

$$R(T_2) = R(T_1) + TCR \cdot R(T_1) \cdot \Delta T$$

The calculated resistance R(t, 30° C.) is compared with the value stored in the memory. An extrinsic defect directly in the vicinity of the via connection leads to a continuous rise in the resistance of the via connection over time. Even if the individual resistance of the via connection rises by 500 or 1000% to 5 or 10Ω, the contact between the via connection and the respective connecting region in a metallization level may still be functional. However, said contact will finally fail over the course of time. If the total resistance of the electrical connection structure rises to approximately 14-24Ω, then this corresponds to a relative rise of 175-300%. If the threshold value for the triggering of the trigger signal was set at 100%, for example, then there is still a sufficient temporal safety margin for the user to take measures before the chip or the module will finally fail.

In this exemplary embodiment, too, provision may be made for not storing the present initial resistance R(0, 30° C.) measured on the chip in the memory, but rather the ideal initial resistance R*(0, 30° C.) calculated under the assumption that the electrical connection structure has ideal surfaces and critical dimensions exactly according to the design rules. Consequently, any deviation in the dimension or the surface quality which has arisen during the processing and which may already form a potential cause of a premature defect can be immediately identified and recorded and pursued further by way of the electrical resistance of the connection structure and its change.

The calculation and assessment can be carried out by means of a small assessment or comparator logic circuit, which only needs to be present once on the chip and can test each connection structure in each metallization level.

Merely for the sake of completeness, the TCR values of the metals used for the metallizations shall also be specified:

AlCu interconnects: $Cr = 3.8 \cdot 10^{-3} \, K^{-1}$

Cu interconnects: $TCR = 3.4 \cdot 10^{-3} \, K^{-1}$

Cu via connections: $TCR = 8.0 \cdot 10^{-3} \, K^{-1}$

FIG. 12 illustrates a flow chart for a test run. A first step S1 involves first interrogating whether the chip is currently in operation. If this is the case, then a step S1a causes the checking of whether the chip is in operation to be checked anew after a predefined time $\Delta t$. If the chip is not in operation, then in a step S2 the electrical resistance of a predetermined electrical connection structure R(t, T) and temperature T(t) of the chip is measured and the measured values are stored. Afterwards, in a step S3, the resistance R(t, 30° C.) is calculated from the measured resistance R(t, T) with the aid of the temperature coefficient TCR stored for the metallization used. This resistance is then compared with the reference value, i.e. the initial resistance R(0, 30° C.), in the subsequent step S4. In the subsequent step S5, the increase in the resistance is calculated and the relative increase is compared with a stored threshold value. The subsequent step S6 involves investigating whether the relative change in resistance $\Delta R/R$ overshoots the threshold value. If this is the case, then in step S7 the trigger signal is output in order to warn the user about the imminent total failure of the chip. If the threshold value has not or not yet been reached, then a decision is taken in step S8 to carry out the test anew after a temporal period $\Delta T_1$.

What is claimed is:

1. A method for determining the reliability of a chip, comprising:
    providing the chip in its intended application environment;
    determining a measurement quantity representing the state of one or a plurality of electrical connections in the chip within the application environment of the chip; and
    outputting a signal if the determined measurement quantity does not correspond to a predefined criterion.

2. The method of claim 1, wherein the measurement quantity is determined with regard to a selected electrical connection structure.

3. The method of claim 1, wherein the measurement quantity is determined in a temporally continuous manner.

4. The method of claim 1, wherein the measurement quantity is determined in predetermined time intervals and/or under predetermined conditions.

5. The method of claim 1, wherein the measurement quantity is the electrical resistance.

6. The method of claim 1, wherein a change in the measurement quantity with respect to time is determined.

7. The method of claim 1, wherein a threshold value is predefined as a criterion for the measurement quantity and the signal is output if the threshold value is overshot or undershot.

8. A method for determining an item of information with regard to the state of an electrical connection in a chip having a plurality of metallization levels and at least one via connection between two metallization levels, the method comprising:
    determining a measurement quantity with regard to a selected electrical connection structure containing at least one via connection; and
    outputting a signal if the determined measurement quantity does not correspond to predefined criteria.

9. The method of claim 8, wherein the chip is supplied to its intended application and the measurement quantity is determined within the application environment of the chip.

10. The method of claim 8, wherein the measurement quantity is determined in a temporally continuous manner.

11. The method of claim 8, the measurement quantity is determined in predetermined time intervals and/or under predetermined conditions.

12. The method of claim 8, wherein the measurement quantity is electrical resistance.

13. The method of claim 8, further comprising determining a change in the measurement quantity over time.

14. The method of claim 8, wherein a threshold value is predefined as a criterion for the measurement quantity and the signal is output if the threshold value is overshot or undershot.

15. An apparatus for determining the reliability of a chip supplied to its intended application and within the application environment of the chip, comprising:
    a measuring circuit determining a measurement quantity representing a state of an electrical connection in the chip, said circuit outputting a corresponding signal if the measurement quantity does not correspond to predefined criteria.

16. The apparatus of claim 15, wherein said measuring circuit selects an electrical connection structure contained in the chip and determines the measurement quantity with regard to the selected electrical connection structure.

17. The apparatus of claim 15, wherein said circuit determines the electrical resistance as the measurement quantity.

18. The apparatus of claim 15, wherein said circuit determines the measurement quantity in a temporally continuous manner.

19. The apparatus of claim 15, wherein said circuit determines the measurement quantity in predetermined time intervals and/or under predetermined conditions.

20. The apparatus of claim 15, wherein said circuit determines the change in the measurement quantity over time.

21. The apparatus of claim 15, wherein said circuit outputs the signal if a threshold value that is predefined for the measurement quantity or for a quantity derived from the measurement quantity is overshot or undershot.

22. An apparatus for determining an item of information with regard to the state of an electrical connection in a chip having a plurality of metallization levels and at least one via connection between two metallization levels, said apparatus comprising:
    a measuring circuit determining a measurement quantity with regard to a selected electrical connection structure containing at least one via connection, the measuring circuit outputting a corresponding signal if the measurement quantity does not correspond to predefined criteria.

23. The apparatus of claim 22, wherein the measurement circuit determines the measurement quantity within the application environment of the chip and, if appropriate, outputs the signal.

24. The apparatus of claim 22, wherein the measurement circuit determines the measurement quantity in a temporally continuous manner.

25. The apparatus of claim 22, wherein the measurement circuit determines the measurement quantity in predetermined time intervals and/or under predetermined conditions.

26. The apparatus of claim 22, wherein the measurement circuit determines the electrical resistance as the measurement quantity.

27. The apparatus of claim 22, wherein the measurement circuit determines a change in the measurement quantity over time.

28. The apparatus of claim 22, wherein the measurement circuit outputs the signal if a threshold value that is predefined for the measurement quantity or for a quantity derived from the measurement quantity is overshot or undershot.

29. A semiconductor chip, comprising:
a an electrical interconnect system; and
an electrical connection structure for testing the reliability of the chip, said structure being arranged outside the electrical interconnect system.

30. The chip of claim 29, wherein the electrical connection elements contained in the electrical connection structure are produced in the same way and/or together with structurally identical electrical connection elements of the electrical interconnect system.

31. The chip of claim 29, wherein the electrical interconnect system has a plurality of metallization levels, and the electrical connection structure has a via connection and/or a contact between a via connection and a connecting region and/or another electrical connection, the connecting region being arranged in a level that is coplanar with one of the metallization levels of the electrical interconnect system.

32. An apparatus, comprising:
a chip supplied to its intended application; and
a measuring circuit, said circuit determining a measurement quantity representing a state of an electrical connection in the chip, said measuring circuit outputting a corresponding signal if the measurement quantity does not correspond to a predefined criteria.

33. The apparatus of claim 32, wherein the measuring circuit selects an electrical connection structure in the chip, and determines the measurement quantity with regard to the selected electrical connection structure.

34. The apparatus of claim 32, wherein the chip has an electrical interconnect system and the electrical connection structure is a part of the interconnect system.

35. The apparatus of claim 32, wherein the chip has an electrical interconnect system, and the electrical connection structure is arranged outside the interconnect system.

36. The apparatus of claim 32, wherein the electrical interconnect system has a plurality of metallization levels and at least one via connection between connecting regions of two metallization levels, and the electrical connection structure has a via connection and/or a contact between a via connection and a connecting region and/or another electrical connection.

37. The apparatus of claim 32, wherein the electrical connection elements contained in the electrical connection structure are produced in the same way and/or together with structurally identical electrical connection elements of the electrical interconnect system.

\* \* \* \* \*